(12) United States Patent
Sugimoto

(10) Patent No.: US 9,812,470 B2
(45) Date of Patent: Nov. 7, 2017

(54) ELECTRO-OPTICAL APPARATUS AND ELECTRONIC APPARATUS

(71) Applicant: Seiko Epson Corporation, Tokyo (JP)

(72) Inventor: Yohei Sugimoto, Fujimi-machi (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 15/065,546

(22) Filed: Mar. 9, 2016

(65) Prior Publication Data

US 2016/0293644 A1  Oct. 6, 2016

(30) Foreign Application Priority Data

Mar. 31, 2015 (JP) .............................. 2015-001533U

(51) Int. Cl.
*H01L 29/12* (2006.01)
*H01L 27/12* (2006.01)
*H01L 29/786* (2006.01)

(52) U.S. Cl.
CPC .... *H01L 27/1255* (2013.01); *H01L 29/78633* (2013.01)

(58) Field of Classification Search
CPC .............. H01L 27/1255; H01L 27/124; H01L 29/42384; H01L 29/78633
See application file for complete search history.

(56) References Cited

U.S. PATENT DOCUMENTS

| | | | | |
|---|---|---|---|---|
| 2007/0029613 | A1* | 2/2007 | Moriwaki | G02F 1/136213 257/347 |
| 2007/0165147 | A1* | 7/2007 | Kamijima | H01L 27/1255 349/38 |
| 2008/0048190 | A1* | 2/2008 | Ishii | G02F 1/136209 257/71 |
| 2014/0183694 | A1* | 7/2014 | Gardner | H01L 28/90 257/532 |

FOREIGN PATENT DOCUMENTS

| JP | 06-075248 A | 3/1994 |
|---|---|---|
| JP | 08-138870 A | 5/1996 |

* cited by examiner

*Primary Examiner* — Trung Q Dang
(74) *Attorney, Agent, or Firm* — ALG Intellectual Property, LLC

(57) ABSTRACT

An electro-optical apparatus includes a first substrate, an interlayer insulation layer which is provided on the first substrate, and a groove which is provided on the interlayer insulation layer, in which a plurality of capacitors (a first capacitive element and a second capacitive element) which are laminated in order of a lower electrode, a lower dielectric film, an relay electrode, an upper dielectric film, and an upper electrode are formed inside the groove.

13 Claims, 10 Drawing Sheets

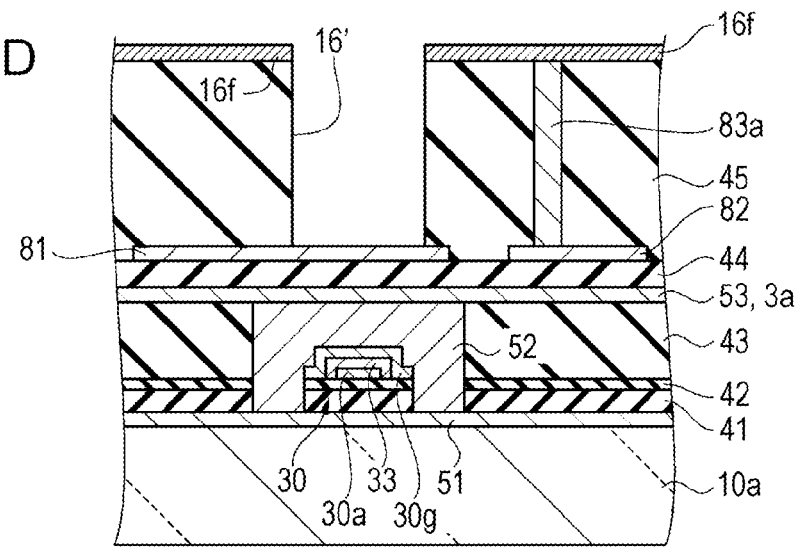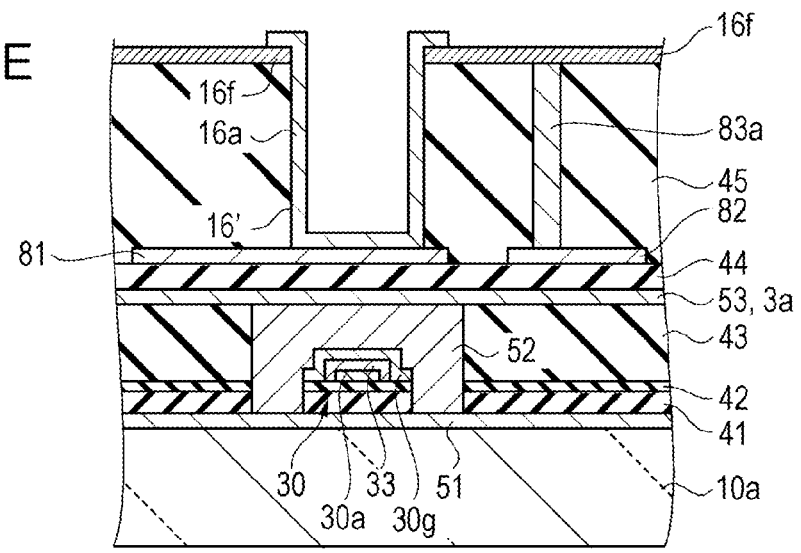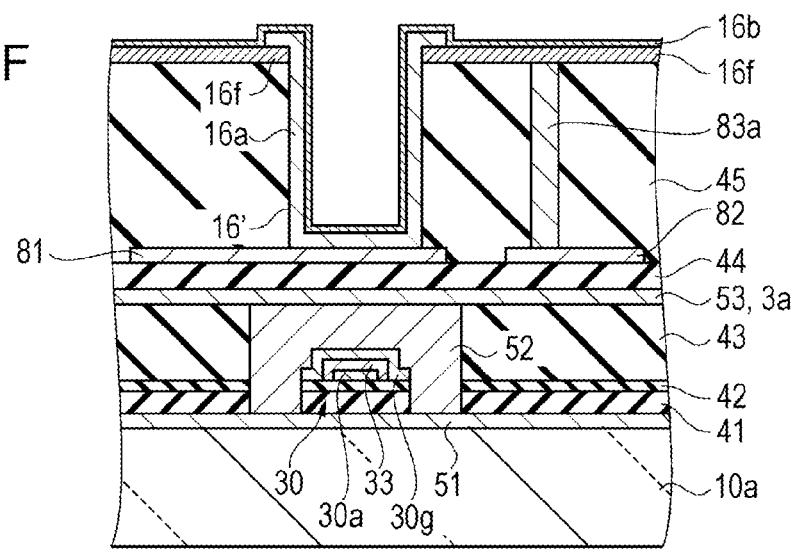

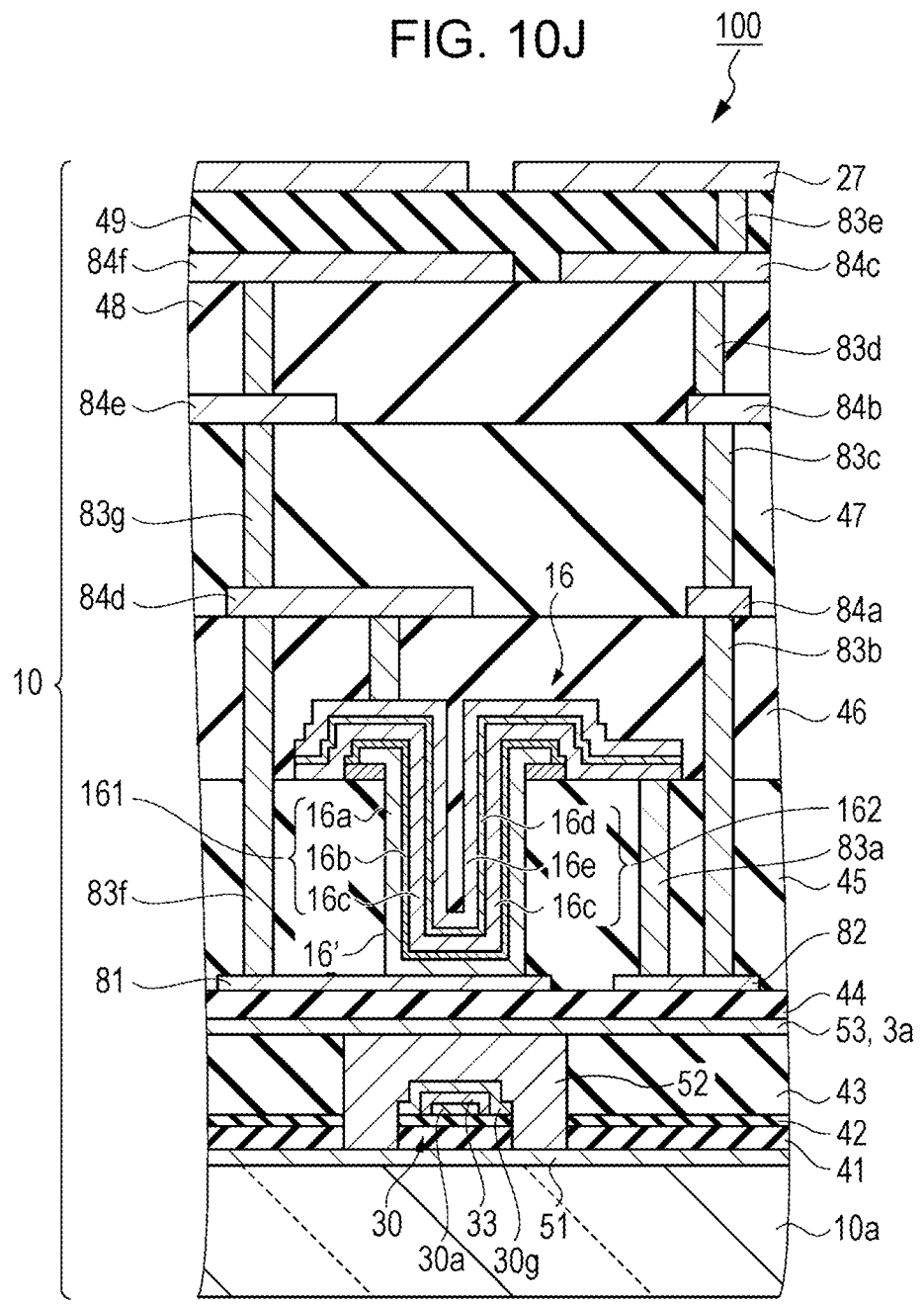

ELECTRO-OPTICAL APPARATUS AND ELECTRONIC APPARATUS

BACKGROUND

1. Technical Field

The present invention relates to an electro-optical apparatus and an electronic apparatus.

2. Related Art

For example, an active drive system liquid crystal device which is provided with a transistor, that switch controls a pixel electrode, in each pixel is known as the electro-optical apparatus. For example, the liquid crystal device is used as a liquid crystal projector liquid crystal light valve as an electronic apparatus.

In the liquid crystal device, a capacitative element is provided with a structure in which a dielectric film is interposed between a pair of capacitative electrodes in order to maintain pixel potential. When the liquid crystal projector has high luminance, since light leakage (current) of a transistor tends to increase, in order to maintain display quality, it is necessary to increase capacitance of the capacitative element. In JP-A-06-075248, for example, a method is disclosed in which a plurality of auxiliary capacitors are provided in a planar direction of a pixel, and capacitance is increased.

However, as in JP-A-06-075248, there is a problem in that an aperture ratio drops due to the need for a large area when the capacitance in a planar direction of pixels increases, and it is not possible to correspond to narrowing of pitch of a pixel pitch or a reduction in size of the liquid crystal device. In addition, when corresponding to narrowing of pitch of the pixel pitch, there is a problem that capacitance is reduced, and it is not possible to correspond to high luminance due to light leakage increasing.

SUMMARY

The invention can be realized in the following aspects or application examples.

Application Example 1

According to this application example, there is provided an electro-optical apparatus including a substrate, an insulation layer which is provided above the substrate, and a groove which is provided with the insulation layer; and, a capacitor which is formed inside the groove and includes a first electrode, a first insulation film, a second electrode, a second insulation film, and a third electrode are laminated in order of mention.

According to this application example, since the plurality of capacitors (capacitative elements) are configured on a laminated film inside the groove (a trench), it is possible to increase capacitance without increasing a planar area. Consequently, it is possible to narrow a pitch of a pixel pitch and improve brightness.

Application Example 2

In the electro-optical apparatus according to the application example, preferably a transistor is provided between the capacitor and on the substrate.

According to the application example, since the capacitor (trench-type capacitor) is disposed on the transistor, it is possible to shield light from light leakage from the transistor using the trench type capacitor. In addition, it is possible to reflect light (such as oblique light) which infiltrates from outside toward the transistor at a side wall of the trench. Consequently, it is possible to suppress the transistor from malfunctioning such as in a case where light is incident to the transistor.

Application Example 3

In the electro-optical apparatus according to the application example, preferably the transistor is provided with a semiconductor layer, and the groove is disposed so as to overlap with the semiconductor layer in planar view.

According to the application example, since the capacitor (groove) is formed so as to overlap with the semiconductor layer, it is possible to shield light leakage from the semiconductor layer (in particular, a lightly doped drain (LDD) region) using the capacitor. In addition, even in a case where a film is used in which an embedding property is good while the light-shielding property is low, it is possible to improve the light-shielding property by laminating the film.

Application Example 4

In the electro-optical apparatus according to the application example, preferably the first electrode, the second electrode, and the third electrode are formed of titanium nitride, and the first insulation film and the second insulation film are formed of high-k film.

According to the application example, it is possible to laminate plurality of capacitative films within the groove using the material, and it is possible to increase capacitance.

Application Example 5

According to this application example, there is provided an electronic apparatus including the electro-optical apparatus.

According to this application example, since the electro-optical apparatus is provided, it is possible to provide the electronic apparatus which is able to reduce size and improve display quality.

BRIEF DESCRIPTION OF THE DRAWINGS

The invention will be described with reference to the accompanying drawings, wherein like numbers reference like elements.

FIGS. 8D to 8F are outline sectional views illustrating a manufacturing method of a portion of the manufacturing method of the liquid crystal device.

FIG. 10J is an outline sectional view illustrating a manufacturing method of a portion of the manufacturing method of the liquid crystal device.

DESCRIPTION OF EXEMPLARY EMBODIMENTS

Embodiments which embody the invention will be described below with reference to the drawings. Here, the drawings which are used are displayed by appropriately enlarging and shrinking such that the portion which is described is in a recognizable state.

Here, in the embodiments below, for example, a case where "on a substrate" is described, a case of disposing so as to come into contact on the substrate, a case of disposing on the substrate via another construction, a case of disposing a portion so as to come into contact on the substrate, or a case where a portion is disposed via another component are represented.

In the present embodiment, an example of an active matrix-type liquid crystal device which is provided with a thin film transistor (TFT) that is given as an example of a switching element will be described. For example, the liquid crystal device is able to be appropriately used as a light modulation element (liquid crystal light valve) of a projection-type display device (liquid crystal projector) which will be described later.

Configuration of Liquid Crystal Device as Electro-Optical Apparatus

Figure 1:
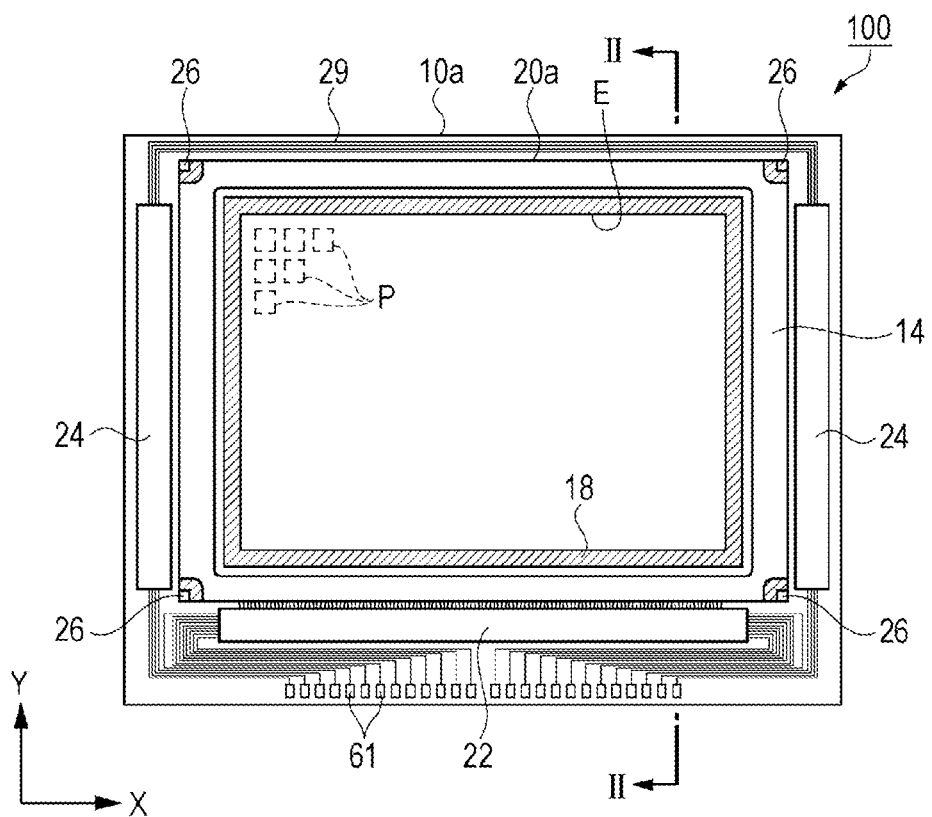
FIG. 1 is a schematic planar view illustrating a configuration of a liquid crystal device.
Figure 2:
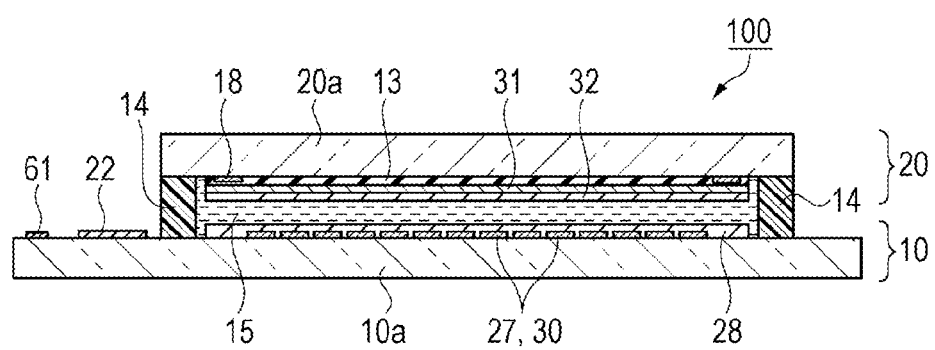
FIG. 2 is a schematic sectional view along line II-II of the liquid crystal device which is illustrated in FIG. 1.
Figure 3:
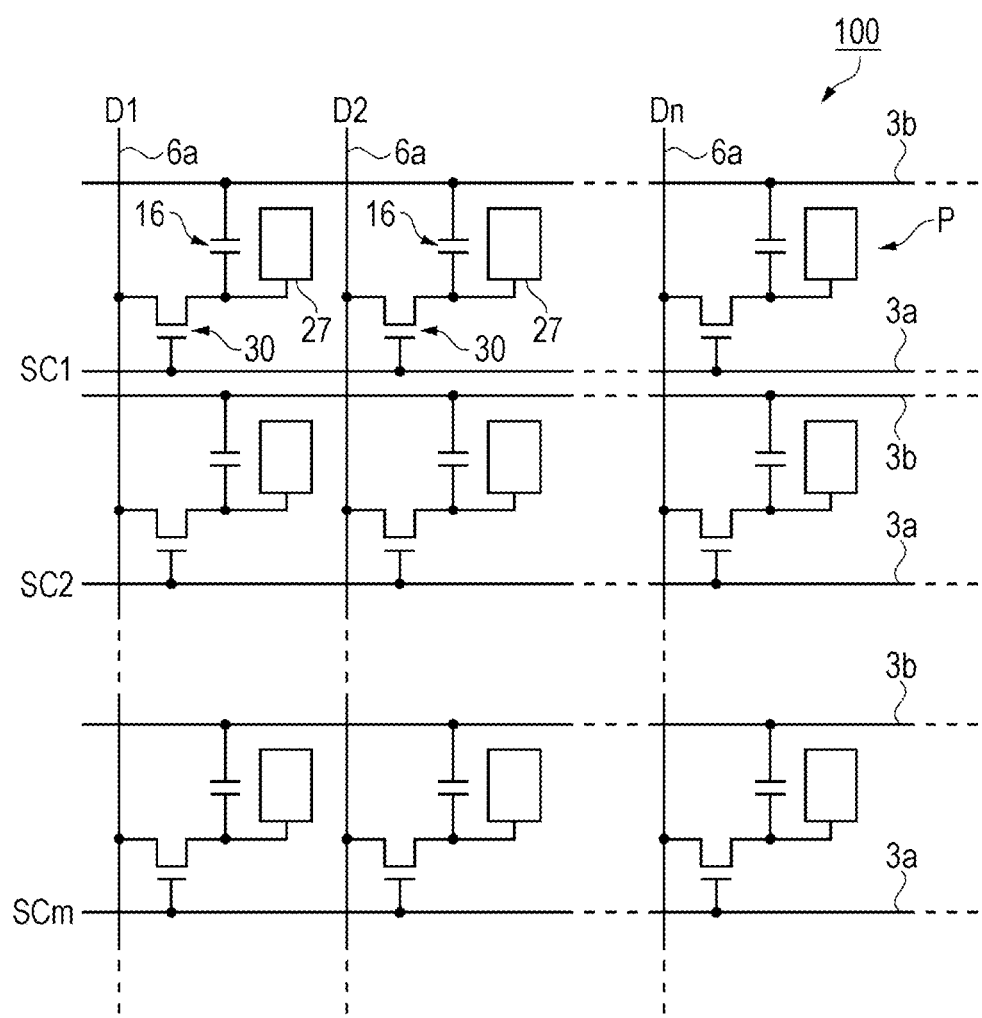
FIG. 3 is an equivalent circuit diagram illustrating an electrical configuration of the liquid crystal device.

FIG. 1 is a schematic planar view illustrating a configuration of the liquid crystal device. FIG. 2 is a schematic sectional view along line II-II of the liquid crystal device which is illustrated in FIG. 1. FIG. 3 is an equivalent circuit diagram illustrating an electrical configuration of the liquid crystal device. Configurations of the liquid crystal device will be described below with reference to FIGS. 1 to 3.

As shown in FIGS. 1 and 2, a liquid crystal device 100 of the present embodiment has an element substrate 10 and an opposing substrate 20 which are disposed facing each other, and a liquid crystal layer 15 which is interposed by the pair of substrates. A first substrate 10a as a substrate which configures the element substrate 10 and a second substrate 20a which configures the opposing substrate 20 use, for example, a transparent substrate such as a glass substrate or a quartz substrate.

The element substrate 10 is larger than the opposing substrate 20, and both substrates are joined via a sealing material 14 which is disposed along the outer periphery of the opposing substrate 20, and configure the liquid crystal layer 15 by enclosing the liquid crystal which has dielectric anisotropy in the gap between both substrates. For example, the sealing material 14 adopts an adhesive such as thermosetting or ultraviolet-curable epoxy resin. A capping material for maintaining the gap between the pair of substrates to be constant is mixed into the sealing material 14.

There is a display region E in which a plurality of pixels P are arranged inside the sealing material 14. A light-shielding layer 18 (parting section) which is made from, for example, metal, metal oxide, or the like with a light-shielding property so as to surround the display region E is disposed between the sealing material 14 and the display region E. Here, the display region E may include a plurality of dummy pixels which are disposed so as to surround the plurality of pixels P which contribute to display.

A data line driving circuit 22 is provided between one side section of the first substrate 10a and the sealing material 14 along the one side section. In addition, an inspection circuit (not shown in the drawings) is provided inside the sealing material 14 along another one side section which faces the one side section. Furthermore, two scanning line driving circuits 24 are provided on another two side sections which face each other and are orthogonal to the one side section. A plurality of wirings 29 which connect the two scanning line driving circuits 24 are provided on the other one side section which faces the one side section.

The wirings which connect the data line driving circuit 22 and the scanning line driving circuits 24 are connected to a plurality of external connection terminals 61 that are arranged along the one side section. Hereafter, the direction along the one side section is described as an X direction, and the direction along the other two side sections which face each other orthogonal to the one side section is described as a Y direction.

As shown in FIG. 2, a pixel electrode 27 which has light permeability that is provided in each pixel P and a thin film transistor 30 (hereinafter, referred to as a "TFT 30") as the switching element, a signal wiring, and a first orientation film 28 which covers these are formed on front surface at the liquid crystal layer 15 side of the first substrate 10a. For example, the pixel electrode 27 is made from a transparent conductive film of indium tin oxide (ITO) or the like.

The light-shielding layer 18, an insulation layer 13 which is formed so as to cover the light-shielding layer 18, a common electrode 31 which is provided so as to cover the insulation layer 13, and a second orientation film 32 which covers the common electrode 31 are provided on the front surface on the liquid crystal layer 15 side of the second substrate 20a.

In the same manner as the pixel electrode 27, the common electrode 31 is made from, for example, a transparent conductive film such as ITO and covers the insulation layer or the like, and is electrically connected to a wiring on the element substrate 10 side by a vertical conduction section 26 which is provided in four corners of the opposing substrate 20 as shown in FIG. 1.

The first orientation film 28 which covers the pixel electrode 27 and the second orientation film 32 which covers the common electrode 31 are inorganic orientation films, and are selected based on an optical design of the liquid crystal device 100. For example, there are examples of substantially vertical orientation with respect to liquid crystal molecules due to formation of an inorganic material such as silicon oxide (SiOx) using a vapor-phase growth method.

Such a liquid crystal device 100 is a transmissive type, and adopts an optical design of a normally black mode in which the pixels P are displayed dark at the time of non-driving or a normally white mode in which the pixels P are displayed bright at the time of non-driving. According to the optical design, a polarization plate is used by being disposed on an incident side (emission side) of light.

As shown in FIG. 3, the liquid crystal device 100 has a plurality of scanning lines 3a and a plurality of data lines 6a which are orthogonal to and insulated from each other in at least the display region E, and a capacitance line 3b which extends in parallel to the scanning lines 3a. The direction in which the scanning lines 3a extend is the X direction, and the direction in which the data lines 6a extend is the Y direction. Here, the capacitance lines 3b are disposed so as to extend in parallel to the data lines 6a.

The pixel electrode 27, the TFT 30, and a capacitative element 16 are provided in a region which is divided according to the signal line type of the scanning lines 3a and the capacitance lines 3b as well as the data lines 6a, and these configure a pixel circuit of the pixels P.

The scanning lines 3a are electrically connected to a gate of the TFT 30, and the data lines 6a are electrically connected to a TFT 30 data line side source and drain region. The pixel electrode 27 is electrically connected to a TFT 30 pixel electrode side source and drain region.

The data lines 6a are connected to the data line driving circuit 22 (refer to FIG. 1), and image signals D1, D2, . . . , Dn which are supplied from the data line driving circuit 22 are supplied to the pixels P. The scanning lines 3a are connected to the scanning line driving circuit 24 (refer to FIG. 1), and scanning signals SC1, SC2, . . . , SCm which are supplied from the scanning line driving circuit 24 are supplied to each pixel P.

The image signals D1 to Dn which are supplied from the data line driving circuit 22 to the data lines 6a may be supplied in order in line order, and may be supplied in groups with respect to each of the plurality of data lines 6a which are adjacent to each other. The scanning line driving circuit 24 supplies the scanning signals SC1 to SCm with respect to the scanning lines 3a at a predetermined timing in line order in a pulsed manner.

The liquid crystal device 100 is configured to write the image signals D1 to Dn which are supplied from the data lines 6a to the pixel electrode 27 at a predetermined timing by the TFT 30 which is a switching element being set in an ON state for a constant period due to the input of the scanning signals SC1 to SCm. Then, the image signals D1 to Dn of a predetermined level which are written to the liquid crystal layer 15 via the pixel electrode 27 are held for a certain period within the common electrode 31 that is disposed in opposition via the pixel electrode 27 and the liquid crystal layer 15.

Since the held image signals D1 to Dn are prevented from leaking, the capacitative element 16 is connected in parallel to a liquid crystal capacitor which is formed between the pixel electrode 27 and the common electrode 31. The capacitative element 16 is provided between the capacitance line 3b and the TFT 30 pixel electrode side source and drain region.

Liquid Crystal Device Pixel Structure

Figure 4:
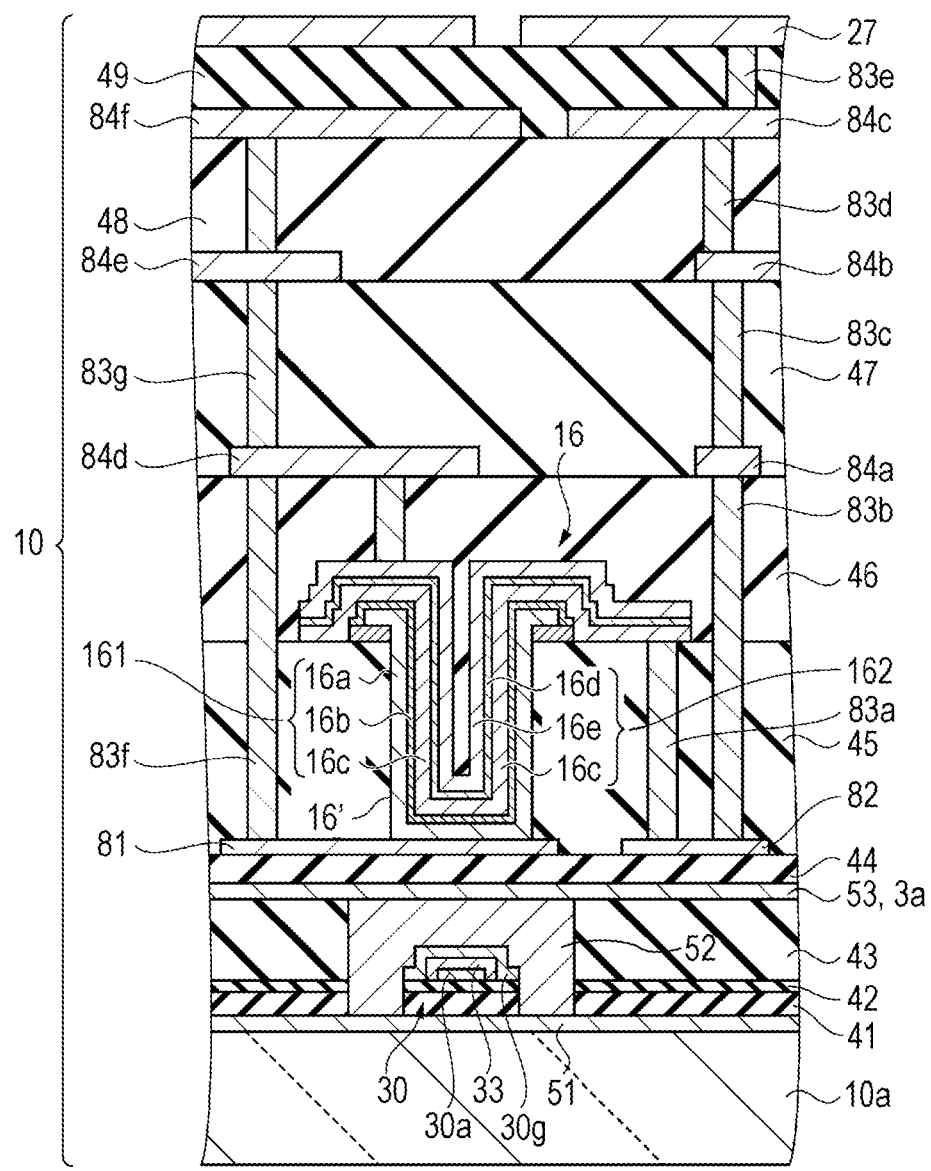
FIG. 4 is an outline sectional view illustrating a structure of a pixel of the liquid crystal device.
Figure 5:
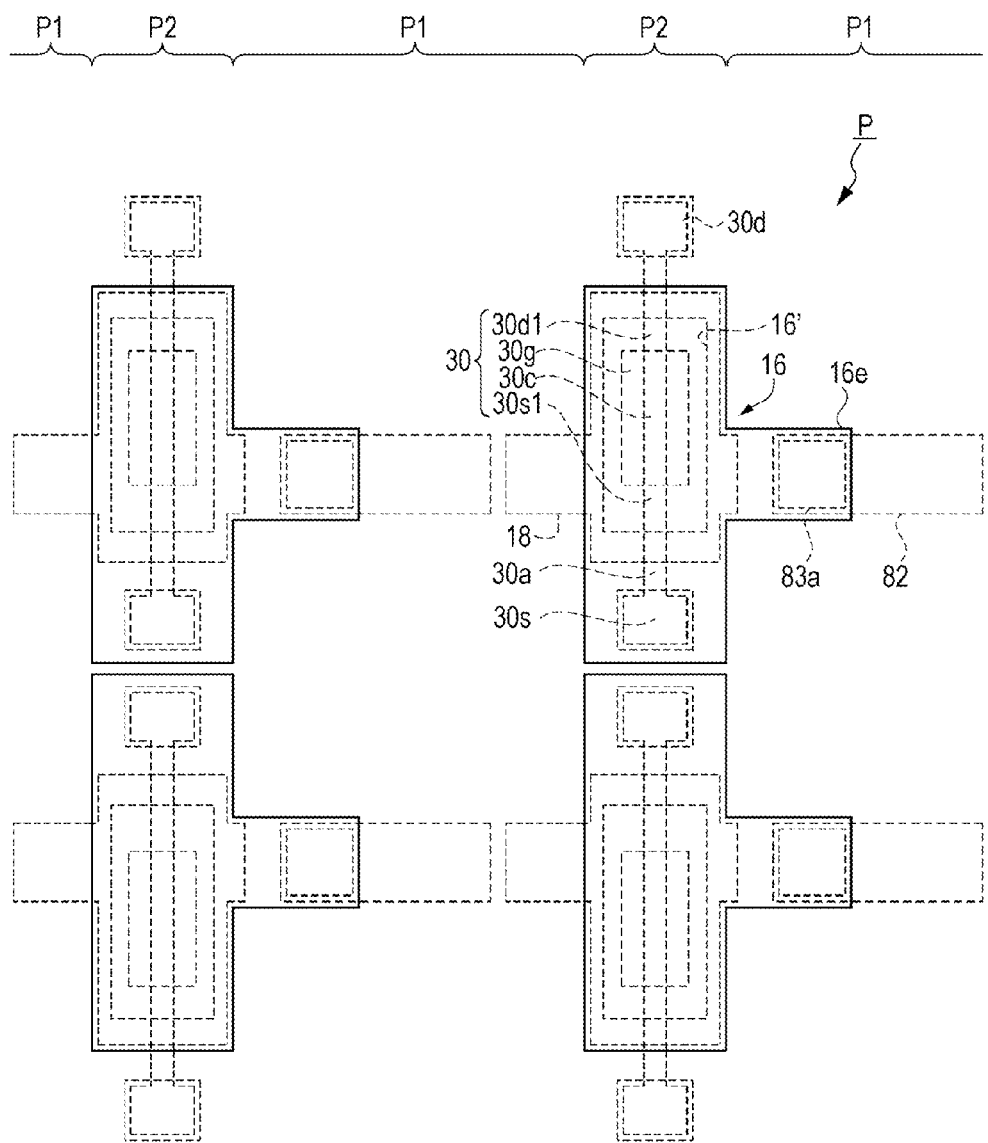
FIG. 5 is an outline perspective view illustrating a structure of the pixel.

FIG. 4 is an outline sectional view illustrating a structure of a pixel of the liquid crystal device. FIG. 5 is an outline perspective view illustrating a structure of the pixel. The structure of the pixel will be described below with reference to FIGS. 4 and 5. Here, FIGS. 4 and 5 show planar or sectional positional relationships of each configuration element, and are represented using presentable measures. In addition, FIG. 5 is an outline perspective view of the pixel viewing the first substrate 10a side from the capacitative element 16.

As shown in FIG. 4, the liquid crystal device 100 is provided with the element substrate 10, and the opposing substrate 20 (refer to FIG. 2) which is disposed to face the element substrate 10. As shown above, the first substrate 10a which configures the element substrate 10 is, for example, configured by a quartz substrate or the like.

For example, a first light-shielding film 51 which is made from tungsten (W), tungsten silicide (WSi), or the like is formed on the first substrate 10a. The first light-shielding film 51 is patterned in a grid pattern in planar view, and regulates an opening region of each pixel P.

A first insulation layer 41 and a second insulation layer 42 which are made from silicon oxide or the like is formed on the first substrate 10a and the first light-shielding film 51.

The TFT 30, the scanning lines 3a (a third light-shielding film 53), and the like are formed on the second insulation layer 42. For example, the TFT 30 has an LDD structure, and a has a semiconductor layer 30a which is made from amorphous silicon (a-Si), polysilicon (poly-Si), or the like, a gate insulation film 33 which is formed on the semiconductor layer 30a, and a gate electrode 30g which is made from polysilicon or the like that is formed on the gate insulation film 33.

In detail, the semiconductor layer 30a is provided with a channel region 30c, a data line side LDD region 30s1, a data line side source and drain region 30s, a pixel electrode side LDD region 30d1, and a pixel electrode side source and drain region 30d (refer to FIG. 5 for all).

A third insulation layer 43 which is made from silicon oxide or the like is formed on the gate electrode 30g and the second insulation layer 42. As described above, the third light-shielding film 53 which is used as the scanning lines 3a is provided on the third insulation layer 43.

In addition, a groove (trench) which passes through from the first light-shielding film 51 to the third light-shielding film 53 is provided in the periphery of the TFT 30 on the first light-shielding film 51. The second light-shielding film 52 which is made from tungsten (W) or the like is embedded within the groove.

As shown in FIG. 4, insulation layers (44 to 49), the capacitative element 16, intermediate layers 81 and 82, relay electrodes 84a to 84f, the pixel electrode 27, and the like are provided on the third light-shielding film 53.

The capacitative element 16 is provided to be connected in parallel to a first capacitative element 161 and a second capacitative element 162 as capacitors inside a groove (trench) 16' which is formed so as to pass through an interlayer insulation layer 45.

In detail, as shown in FIG. 4, from the outside of the groove 16', a lower electrode 16a as a first electrode, a lower dielectric film 16b as a first insulation film, an relay electrode 16c as a second electrode, an upper dielectric film 16d as a second insulation film, and an upper electrode 16e as a third electrode are laminated. The first capacitative element 161 is formed using the lower electrode 16a, the lower dielectric film 16b, and the relay electrode 16c. The second capacitative element 162 is formed using the relay electrode 16c, the upper dielectric film 16d, and the upper electrode 16e.

The material of the lower electrode 16a, the relay electrode 16c, and the upper electrode 16e, is for example, titanium nitride (TiN). The material of the lower dielectric film 16b (capacitative film) and the upper dielectric film 16d (capacitative film) is for example, high-K film (high-dielectric-constant film).

In addition, the film thickness of the lower electrode 16a, the relay electrode 16c, and the upper electrode 16e is for example 500 Å or less. The film thickness of the lower dielectric film 16b and the upper dielectric film 16d is for example 200 Å. In addition, the depth of the groove 16' is for example 10000 Å.

The lower electrode 16a is electrically connected to the upper relay electrode 84d via the first intermediate layer 81 which is formed on the lower layer, and the contact hole 83f. For example, the relay electrode 84d is a common wiring. For example, the voltage which is applied to the common wiring is 7 V.

The material of the first intermediate layer 81 is aluminum. In addition, the first intermediate layer 81 performs a role of an etching stopper when the groove 16' (trench) is formed. Furthermore, the first intermediate layer 81 performs a role of shielding a potential from the gate electrode 30g.

The relay electrode 16c is electrically connected to the pixel electrode 27 via the contact holes 83a, 83b, 83c, 83d, and 83e, the second intermediate layer 82, and the relay electrodes 84a, 84b, and 84c. For example, the voltages which are applied to the relay electrode 16c is 2 V and 12 V.

In this manner, since the capacitative element 16 which is connected in parallel to the first capacitative element 161 and the second capacitative element 162 is provided within the deep groove 16', it is possible to increase the capacitance of the capacitative element 16 without widening the region of the capacitative element 16 in a planar direction of the pixels P. Consequently, since the region of the capacitative element 16 is not widened in the planar direction, it is possible to reduce the area of the light-shielding region P2, and it is possible to improve the aperture ratio. Additionally, it is possible to form the pixels P at a narrow pitch. Furthermore, since it is possible to increase the capacitance of the capacitative element 16, it is possible to adopt the invention in a liquid crystal projector with high luminance.

As shown in FIG. 5, the trench-type capacitative element 16 is disposed so as to overlap with the semiconductor layer 30a which configures the TFT 30 in planar view. In other words, the trench-type capacitative element 16 is disposed on the TFT 30.

As shown in FIG. 5, the pixel P has an opening region P1 and a light shielding region P2 which is on the periphery of the opening region P1. The pixel P which is illustrated in FIG. 5 is formed by the semiconductor layer 30a so as to overlap with the first light-shielding film 51 (refer to FIG. 4) which is formed in the light shielding region P2.

One end and another end of the semiconductor layer 30a are the source and drain regions 30s and 30d. The gate electrode 30g is disposed in the region which overlaps with the channel region 30c of the semiconductor layer 30a.

In this manner, since the capacitative element 16 is disposed on the TFT 30, and the trench-type capacitative element 16 is disposed to overlap along the extension direction of the semiconductor layer 30a, it is possible to improve the light-shielding property. For example, it is possible to shield light from light leakage from the TFT 30 (in particular, the LDD regions 30s1 and 30d1 of the semiconductor layer 30a) using the trench-type capacitative element 16, and it is possible to suppress light leakage from infiltrating into the opening region P1.

In addition, since the capacitative element 16 is configured by laminating a plurality of layers within the deep groove 16', for example, it is possible to reflect light using a side wall of the trench-type capacitative element 16 even in a case where light from outside becomes oblique light and infiltrates toward the TFT 30. Consequently, it is possible to improve luminance by concentrating light in the direction of the opening region P1, and it is possible to suppress malfunctions of the TFT 30 by irradiating on the TFT 30.

Furthermore, since the capacitative element 16 is configured by laminating the film within the groove 16', for example, the light-shielding property is low even in a case where a material with a good embedding property of the film is used, since the film is laminated, it is possible to establish the light-shielding property, and it is possible to shield light from light leakage.

In addition, as shown in FIG. 4, the pixel electrode 27 is connected to a portion of the capacitative element 16, and although not illustrated, is electrically connected to the pixel electrode side source and drain region 30d (drain region) of the semiconductor layer 30a.

The first orientation film 28 (refer to FIG. 2) which obliquely evaporates a non-organic material such as silicon oxide ($SiO_2$) is provided on the insulation layer (49) between the pixel electrode 27 and the adjacent pixel electrode 27. The liquid crystal layer 15 which is enclosed by liquid crystal or the like in a space that is surrounded by the sealing material 14 (refer to FIGS. 1 and 2) is provided on the first orientation film 28. The opposing substrate 20 (refer to FIG. 2) is disposed so as to face the element substrate 10 on the liquid crystal layer 15.

Liquid Crystal Device Manufacturing Method

Figure 6:
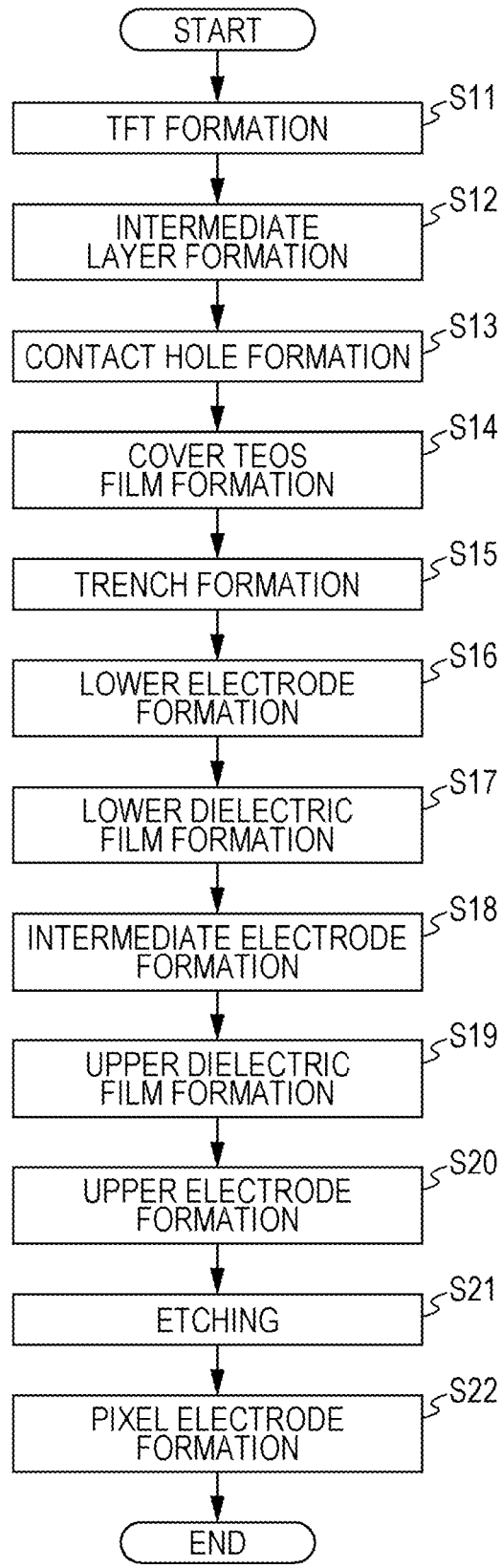
FIG. 6 is a flow chart illustrating a manufacturing method of the liquid crystal device in process order.

FIG. 6 is a flow chart illustrating a manufacturing method of the liquid crystal device in process order. FIGS. 7A to 10J are outline sectional views illustrating a manufacturing method of a portion of the manufacturing method of the liquid crystal device. The manufacturing method of the liquid crystal device will be described below with reference to FIGS. 6 to 10J. Here, the manufacturing method of the element substrate which is the main component of the liquid crystal device will be described.

Figure 7A:
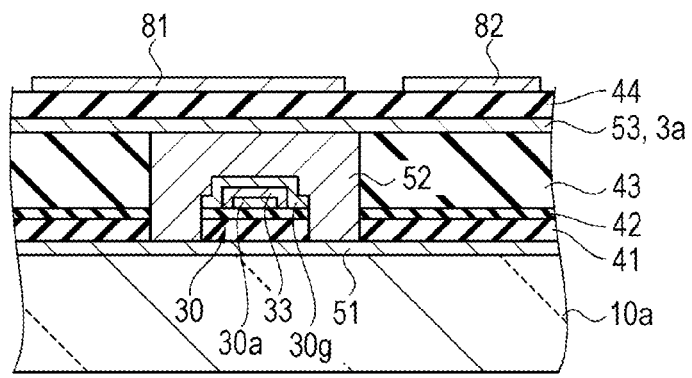
FIGS. 7A to 7C are outline sectional views illustrating a manufacturing method of a portion of the manufacturing method of the liquid crystal device.

As shown in FIG. 6, the TFT 30 is formed in step S11. In detail, as shown in FIG. 7A, the TFT 30 is formed on the first substrate 10a which is made from a quartz substrate or the like. First, the first light-shielding film 51 which is made from tungsten silicide (WSi) or the like is formed on the first substrate 10a. After this, the TFT 30 is formed via the insulation layers 41 and 42 which are made from silicon oxide ($SiO_2$) or the like.

As the manufacturing method of the TFT 30, it is possible to use the known film forming technique, the photolithography technique, and the etching technique. Next, the second light-shielding film 52 which is made from tungsten or the like is formed on the periphery of the TFT 30 in order to shield light from the TFT 30 from light leakage, and the third light-shielding film 53 (scanning line 3a) which is made from aluminum or the like is formed on the second light-shielding film 52 and the third insulation layer 43. Here, detailed description of the manufacturing method is omitted.

The first intermediate layer 81 and the second intermediate layer 82 are formed in step S12. In detail, in the same manner as shown in FIG. 7A, first, the interlayer insulation layer 44 which is made from silicon oxide or the like is formed on the third light-shielding film 53.

Next, the first intermediate layer 81 for connecting to a portion of the capacitative element 16 and the second intermediate layer 82 for connecting to a portion of the capacitative element 16 are formed. It is possible to use the known film forming technique (for example, a chemical vapor deposition (CVD) technique), the photolithography technique, and the etching technique as the formation method of the first intermediate layer 81 and the second intermediate layer 82.

Figure 7B:
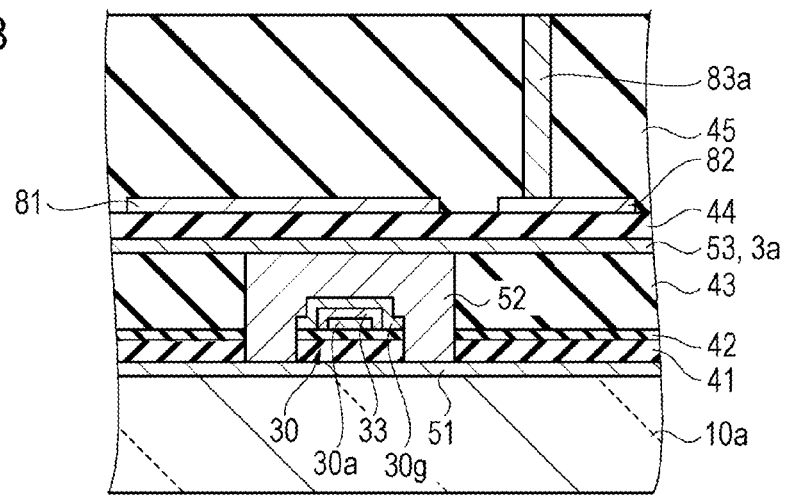

The contact hole 83a is formed in step S13. In detail, first, as shown in FIG. 7B, the interlayer insulation layer 45 which is made from silicon oxide or the like is formed on the first intermediate layer 81, the second intermediate layer 82, and the interlayer insulation layer 44. Next, the contact hole 83a which passes to the second intermediate layer 82 is formed on the interlayer insulation layer 45. After this, tungsten is embedded in the contact hole 83a. After this, a chemical mechanical polishing (CMP) process is carried out in order to flatten unevenness which is generated on the front surface of the interlayer insulation layer 45.

Figure 7C:
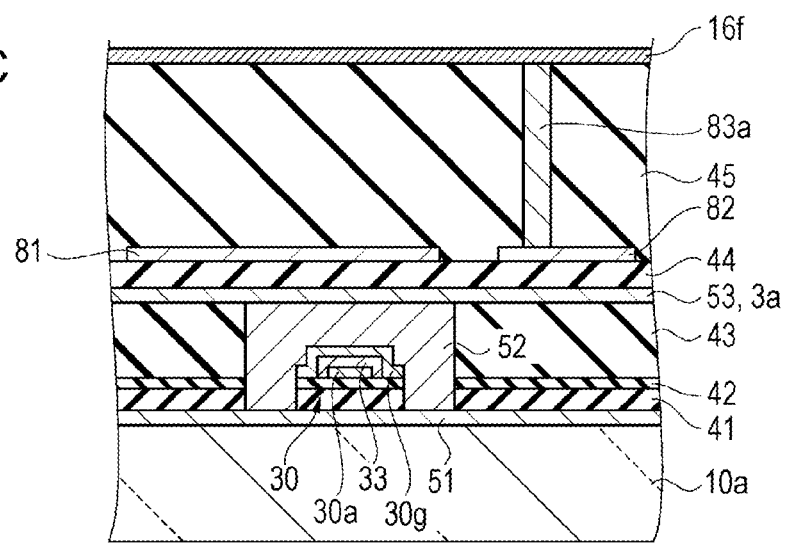

A cover tetra ethyl ortho silicate (TEOS) film 16*f* is formed in step S14. In detail, as shown in FIG. 7C, the cover TEOS film 16*f* is formed on the interlayer insulation layer 45. The cover TEOS film 16*f* is used in order to prevent the contact hole 83*a* from corroding in subsequent processes.

Next, the groove 16' (trench) is formed in step S15. In detail, as shown in FIG. 8D, the trench 16' for forming the capacitative element 16 which passes to the first intermediate layer 81 is formed on the interlayer insulation layer 45. In other words, the trench 16' is formed in a region which overlaps with the semiconductor layer 30*a* in planar view.

It is possible to use the known photolithography technique and the etching technique as the formation method of the trench 16'. For example, the depth of the trench 16' is 1000 Å or more, and preferably 10000 Å or more. For example, the width of the trench 16' is 0.45 μm.

The lower electrode 16*a* is formed in step S16. In detail, as shown in FIG. 8E, first, for example, titanium nitride is formed into a film using the CVD technique across from within the trench 16' to on the cover TEOS film 16*f*. Next, the lower electrode 16*a* is patterned using the photolithography technique and the etching technique. For example, the thickness of the lower electrode 16*a* is 1500 Å.

The lower dielectric film 16*b* is formed in step S17. In detail, as shown in FIG. 8F, the lower dielectric film 16*b* which is made from the high-K film (high-dielectric-constant film) is formed across from the lower electrode 16*a* within the trench 16' to on the cover TEOS film 16*f*. For example, the thickness of the lower dielectric film 16*b* is 250 Å.

Figure 9G:
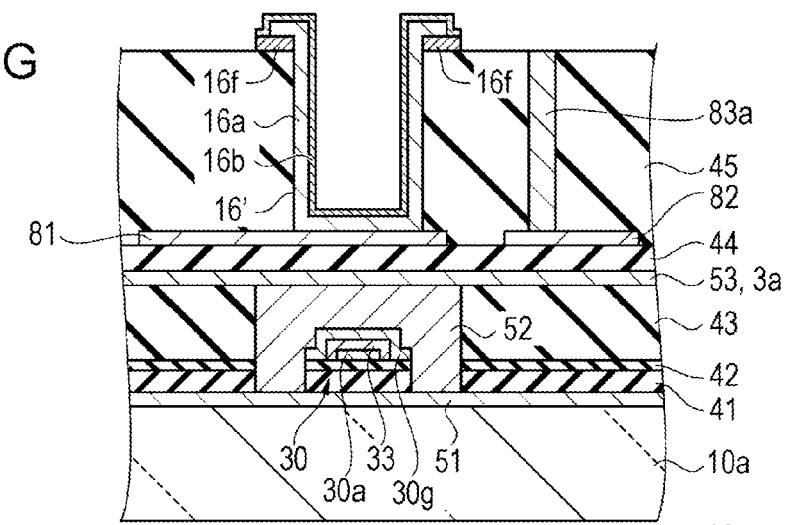
FIGS. 9G to 9I are outline sectional views illustrating a manufacturing method of a portion of the manufacturing method of the liquid crystal device.

Next, as shown in FIG. 9G, the lower dielectric film 16*b* and the cover TEOS film 16*f* are patterned. As the manufacturing method, it is possible to form using the photolithography technique and the etching technique. Thereby, the lower dielectric film 16*b* is formed from within the trench 16' over an edge of the trench 16', and the upper surface of the contact hole 83*a* is exposed.

In addition, since the lower dielectric film 16*b* remains in the light-shielding region P2 (region of the capacitative element 16), and the lower dielectric film 16*b* of the opening region P1 is removed, it is possible to suppress the reduction of transparency of the opening region P1.

Figure 9H:
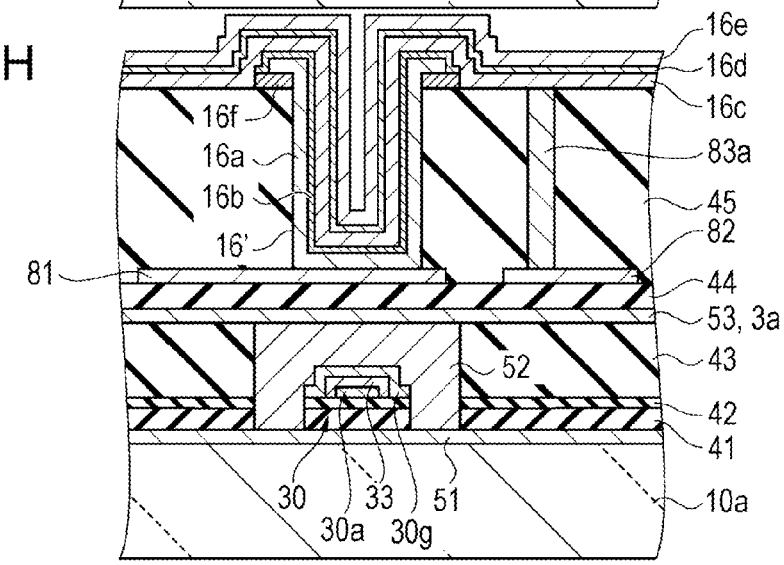

The relay electrode 16*c* is formed in step S18. The upper dielectric film 16*d* is formed in step S19. The upper electrode 16*e* is formed in step S20. In detail, as shown in FIG. 9H, the relay electrode 16*c*, the upper dielectric film 16*d*, and the upper electrode 16*e* are formed in that order across the entire surface of the lower dielectric film 16*b* and the interlayer insulation layer 45.

For example, the relay electrode 16*c* is titanium nitride (TiN). For example, the upper dielectric film 16*d* is a high-k film. For example, the upper electrode 16*e* is titanium nitride (TiN).

For example, it is possible to use the CVD technique as the manufacturing methods. For example, the film thickness of the relay electrode 16*c* is 500 Å. For example, the film thickness of the upper dielectric film 16*d* is 250 Å. For example, the film thickness of the upper electrode 16*e* is 500 Å.

Figure 9I:
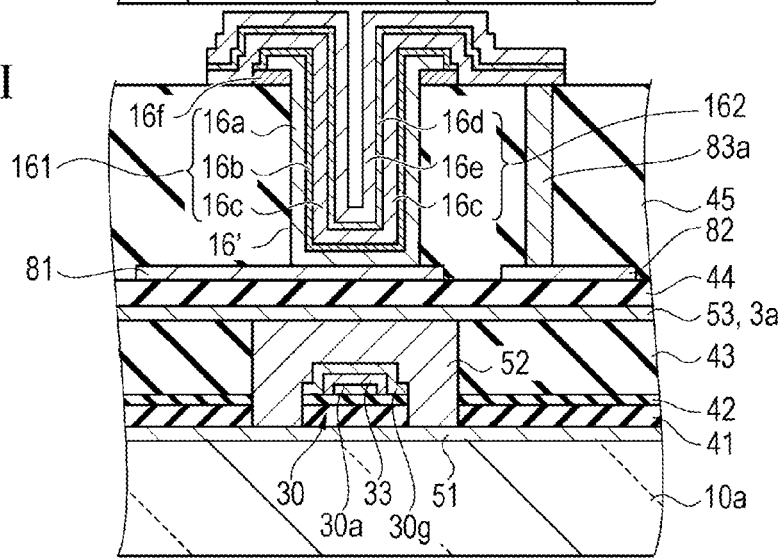

The etching process is performed in step S21. In detail, as shown in FIG. 9I, the relay electrode 16*c*, the upper dielectric film 16*d*, and the upper electrode 16*e* are collectively patterned such that the relay electrode 16*c* and the contact hole 83*a* are electrically connected. For example, the etching process is dry etching.

As described above, the first capacitative element 161 which is configured by the lower electrode 16*a*, the lower dielectric film 16*b*, and the relay electrode 16*c*, and the second capacitative element 162 which is configured by the relay electrode 16*c*, the upper dielectric film 16*d*, and the upper electrode 16*e* are formed within the trench 16'.

In this manner, it is possible to configure the parallel capacitances sterically, and it is possible to narrow the light shielding region P2 by providing the first capacitative element 161 and the second capacitative element 162 connected in parallel within the trench 16'. As a result, it is possible to narrow the pitch of the pixel pitch.

Here, the necessary capacitance in a typical liquid crystal device 100 is to the extent of 40 fF. The capacitance of a single-type capacitative element is to the extent of 10 fF. The capacitance of a parallel-type capacitative element is to the extent of 20 fF.

However, as shown in the embodiment, it is possible to improve the capacitance to the extent of 60 to 70 fF by forming the capacitative element which is connected in parallel within the trench structure. Thereby, for example, it is possible to perform display at high display quality even if the liquid crystal device is miniaturized (for example, the pixel pitch is 4 μm and the aperture ratio is 60%).

The pixel electrode 27 is formed in step S22. In detail, as shown in FIG. 10J, the pixel electrode 27 is formed on the capacitative element 16 via the interlayer insulation layers 46 to 49, the contact holes 83*b* to 83*g*, the relay electrodes 84*a* to 84*f*, and the like. Next, the first orientation film 28 is formed using an oblique deposition method so as to cover the pixel electrode 27 and the like. As described above, the element substrate 10 side is completed.

The lower electrode 16*a* and the upper electrode 16*e* which configure the capacitative element 16 are connected to the common wiring 84*e* via the first intermediate layer 81, the contact holes 83*f* and 83*g*, the relay electrode 84*d*, and the like. Meanwhile, the relay electrode 16*c* is electrically connected to the pixel electrode 27 via the contact holes 83*a* to 83*e*, the second intermediate layer 82, the relay electrodes 84*a* to 84*c*, and the like.

Configuration of Electronic Apparatus

Figure 11:
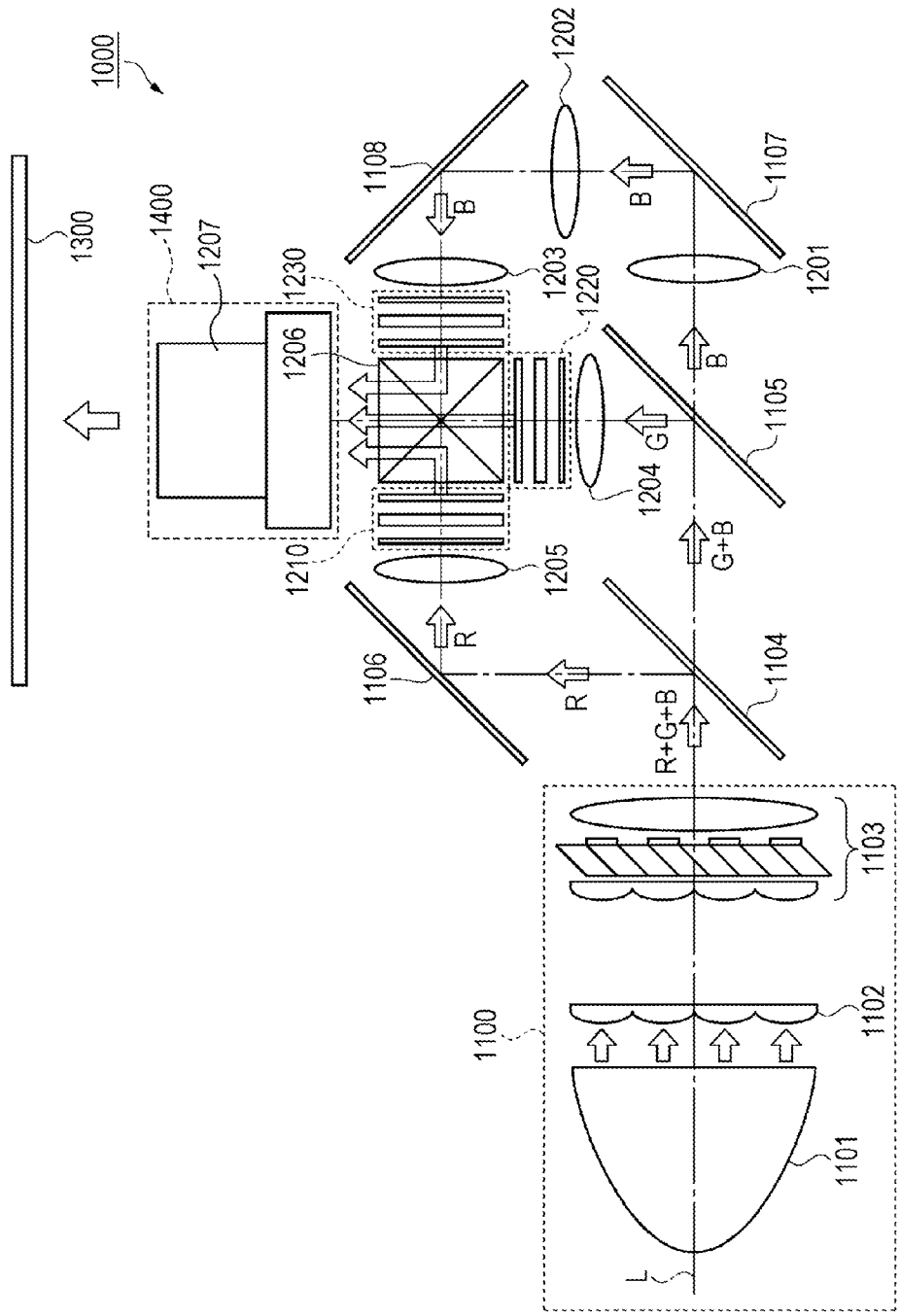
FIG. 11 is a schematic view illustrating a configuration of a projector as an electronic apparatus.

FIG. 11 is a schematic view illustrating a configuration of a projector as an electronic apparatus. The configuration of the projector will be described below with reference to FIG. 11.

As shown in FIG. 11, a projector 1000 of the embodiment is provided with a polarized light illumination device 1100 as an illumination system which is disposed along a system optical axis L, two dichroic mirrors 1104 and 1105 as light separation elements, three reflective mirrors 1106, 1107, and 1108, five relay lenses 1201, 1202, 1203, 1204, and 1205, transmissive type liquid crystal light valves 1210, 1220, and 1230 as three light modulation means, a cross dichroic prism 1206 as a light-combining element, and a projection lens 1207.

The polarized light illumination device 1100 is configured in outline from a lamp unit 1101 as a light source made from a white light source such as an ultra-high pressure mercury lamp or a halogen lamp, an integrator lens 1102, and a polarization conversion element 1103.

The dichroic mirror 1104 reflects red light (R), and transmits green light (G) and blue light (B) out of polarized light beams which are emitted from the polarized light illumination device 1100. The other dichroic mirror 1105 reflects the green light (G) which passes through the dichroic mirror 1104, and transmits the blue light (B).

The red light (R) which is reflected by the dichroic mirror 1104 is incident to the liquid crystal light valve 1210 via the relay lens 1205 after being reflected by the reflective mirror 1106. The green light (G) which is reflected by the dichroic mirror 1105 is incident to the liquid crystal light valve 1220 via the relay lens 1204. The blue light (B) which is transmitted by the dichroic mirror 1105 is incident to the liquid crystal light valve 1230 via a light guide system that is made from three relay lenses 1201, 1202, and 1203, and two reflective mirrors 1107, and 1108.

The liquid crystal light valves 1210, 1220, and 1230 are disposed facing respective incident surfaces of each color of light of the cross dichroic prism 1206. The color of light which is incident to the liquid crystal light valves 1210, 1220, and 1230 is emitted toward the cross dichroic prism 1206 that modulates based on moving image information (a moving image signal).

The prism is four rectangular prisms bonded together, and a dielectric multilayer film which reflects the red light on the inner surface of the prism and a dielectric multilayer film which reflects the blue light are formed in a cross shape. The dielectric multilayer films combine light which represents a color image by combining the three colors of light. The combined light is projected on a screen 1300 by the projection lens 1207 which configures a projection optical system 1400, and is displayed by enlarging the image.

The liquid crystal light valve 1210 is applied by the liquid crystal device 100 which will be described later. The liquid crystal device 100 is disposed in a gap between a pair of polarization elements that are in a cross Nicol disposition on the incidence side and the emission side of the color light. The other liquid crystal light valves 1220 and 1230 are the same.

As described above in detail, according to the liquid crystal device 100 and the projector 1000 of the embodiment, the effects which are illustrated below are obtainable.

(1) According to the liquid crystal device 100 of the embodiment, since the plurality of capacitors are formed inside the trench 16', it is possible to increase capacitance without increasing the planar area. Consequently, it is possible to narrow a pitch of a pixel pitch, and it is possible to improve brightness. In addition, since it is possible to form the two capacitors (first capacitative element 161 and second capacitative element 162) which are connected in parallel, and it is possible to use the side wall of the trench 16' and a stepped portion as the capacitor, it is possible to increase the capacitance of the capacitative element 16.

(2) According to the liquid crystal device 100 of the embodiment, since the trench-type capacitative element 16 is disposed so as to overlap with the TFT 30 (semiconductor layer 30a), it is possible to shield light leakage from the TFT 30 (in particular, a lightly doped drain (LDD) region) using the capacitative element 16. In addition, for example, even if the capacitative element 16 has a low light-shielding property and is formed using a material with a good embedding property of a film, it is possible to improve the light-shielding property by laminating a film in a depth direction within the trench 16'.

(3) According to the liquid crystal device 100 of the embodiment, since the trench-type capacitative element 16 is disposed on the TFT 30, it is possible to reflect light (such as oblique light) which infiltrates from outside toward the TFT 30 on a side wall of the trench-type capacitative element 16. Consequently, it is possible to suppress the TFT 30 from malfunctioning such as in a case where light is incident to the TFT 30.

(4) According to the projector 1000 of the embodiment, since the liquid crystal device 100 which is described above is provided, it is possible to provide the projector 1000 which is able to correspond to a reduction in size, and display with high quality.

Here, the aspects of the invention are not limited to the embodiments described above, and are able to be appropriately modified within a range that does not depart from the gist or spirit of the invention which is read from the claims and the entire specification, and is included in the technical range of the aspect of the invention. In addition, it is also possible to implement the following forms.

Modification Example 1

The material of the lower dielectric film 16b and the upper dielectric film 16d is not limited to the high-k film (high-dielectric-constant film) as described above, and for example, may use silicon oxide, silicon nitride, a metal oxide ($SiO_2$, $SiN$, $Y_2O_2$, $HfO_2$, $ZrO_2$, HfSiO, and the like), or a high dielectric constant insulating film ($HfO_2$, $ZrO_2$, $Al_2O_3$, and the like). In addition, silicon oxide, silicon nitride, metal oxide, and metal silicon oxide with a dielectric constant of 3.8 or more, or 3.8 or more and 30 or less may be used.

Modification Example 2

The invention is not limited to the capacitative element 16 being electrically connected to the common wiring by the lower electrode 16a and the upper electrode 16e, and electrically connected to the pixel electrode 27 by the relay electrode 16c as described above, and may be connected as below. The lower electrode 16a and the upper electrode 16e may be electrically connected to the pixel electrode 27, and the relay electrode 16c may be electrically connected to the common wiring.

Modification Example 3

The invention is not limited to the method for forming the laminated film of the capacitative element 16 using the CVD technique as described above, and for example, the laminated film may be formed using an atomic layer deposition (ALD) technique in which a throwing property of a film is good within the trench 16'.

Modification Example 4

The invention is not limited to the lower electrode 16a, the relay electrode 16c, and the upper electrode 16e which configure the capacitative element 16 using titanium nitride (TiN) as described above, and may use tantalum nitride (TaN), tungsten (W), or aluminum (Al).

Modification Example 5

The invention is not limited to application to the liquid crystal device 100 as the electro-optical apparatus as described above, and for example, may be applied to an apparatus which has an element or the like in which light leakage is generated.

This application claims priority to Japan Utility Model Application No. 2015-001533 filed Mar. 31, 2015, the entire disclosures of which are hereby incorporated by reference in their entireties.

What is claimed is:

1. An electro-optical apparatus comprising:
a substrate;
an insulation layer which is disposed above the substrate;
a groove which is disposed in the insulation layer; and
a first capacitor which is disposed at the groove and has a first electrode, a first insulation film disposed on the first electrode, and a second electrode disposed on the first insulation film, and
a second capacitor which is disposed on the first capacitor and has the second electrode, a second insulation film disposed on the second electrode, and a third electrode disposed on the second insulation film.

2. The electro-optical apparatus according to claim 1, further comprising:
a transistor which is provided between the first capacitor and the substrate.

3. The electro-optical apparatus according to claim 2, wherein the transistor has a semiconductor layer, and
the groove is disposed so as to overlap with the semiconductor layer in a planar view.

4. The electro-optical apparatus according to claim 1, wherein the first electrode, the second electrode, and the third electrode are formed of titanium nitride, and
the first insulation film and the second insulation film are formed of high-k film.

5. An electronic apparatus comprising:
the electro-optical apparatus according to claim 1.

6. An electronic apparatus comprising:
the electro-optical apparatus according to claim 2.

7. An electronic apparatus comprising:
the electro-optical apparatus according to claim 3.

8. An electronic apparatus comprising:
the electro-optical apparatus according to claim 4.

9. The electro-optical apparatus according to claim 2, wherein:
the transistor has a gate electrode; and
the gate electrode is disposed so as to overlap with the groove in a planar view.

10. The electro-optical apparatus according to claim 2, wherein:
the transistor has a gate electrode;
the groove is disposed in a first region of the insulation layer; and
the gate electrode is disposed so as to overlap with the first region in a planar view.

11. The electro-optical apparatus according to claim 1, further comprising:
a pixel electrode which is disposed above the substrate and is electrically connected to the second electrode; and
a common wiring which is disposed above the substrate and is electrically connected to the first electrode and the third electrode.

12. The electro-optical apparatus according to claim 1, further comprising:
a pixel electrode which is disposed above the substrate and is electrically connected to the first electrode and the third electrode; and
a common wiring which is disposed above the substrate and is electrically connected to the second electrode.

13. An electro-optical apparatus comprising:
a substrate;
an insulation layer which is disposed above the substrate and has a groove;
a first capacitor which is disposed in the groove;
a second capacitor which is disposed on the first capacitor in the groove;
a first electrode which is disposed on the insulation layer in the groove;
a first insulation film which is disposed on the first electrode;
a second electrode which is disposed on the first insulation film;
a second insulation film which is disposed on the second electrode; and
a third electrode which is disposed on the second insulation film,
wherein
the first capacitor is configured by the first electrode, the first insulation film, and the second electrode, and
the second capacitor is configured by the second electrode, the second insulation film, and the third electrode.

* * * * *